United States Patent
Mu et al.

(10) Patent No.: US 8,947,940 B2
(45) Date of Patent: Feb. 3, 2015

(54) STRUCTURE AND METHOD FOR HEALING TUNNEL DIELECTRIC OF NON-VOLATILE MEMORY CELLS

(75) Inventors: Fuchen Mu, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 309 days.

(21) Appl. No.: 13/361,191

(22) Filed: Jan. 30, 2012

(65) Prior Publication Data

US 2013/0194875 A1 Aug. 1, 2013

(51) Int. Cl.
G11C 16/04 (2006.01)

(52) U.S. Cl.
USPC .................................. 365/185.3; 365/185.23

(58) Field of Classification Search
USPC ............... 365/185.3, 185.23, 185.26, 185.28, 365/185.33
See application file for complete search history.

(56) References Cited

U.S. PATENT DOCUMENTS

| | | | |
|---|---|---|---|
| 5,508,959 A | 4/1996 | Lee et al. | |
| 5,619,454 A | 4/1997 | Lee et al. | |
| 6,426,898 B1 | 7/2002 | Mihnea et al. | |
| 6,484,232 B2 | 11/2002 | Olarig et al. | |
| 6,493,280 B2 | 12/2002 | Mihnea et al. | |
| 7,495,966 B2 | 2/2009 | Aritome | |
| 8,065,573 B2 | 11/2011 | Abts et al. | |
| 8,238,170 B2 * | 8/2012 | Mihnea et al. | 365/185.3 |
| 8,542,542 B2 * | 9/2013 | Mihnea et al. | 365/185.3 |
| 2002/0121653 A1 * | 9/2002 | Mihnea et al. | 257/261 |
| 2010/0025811 A1 | 2/2010 | Bronner et al. | |
| 2010/0165747 A1 | 7/2010 | Mihnea et al. | |
| 2012/0140569 A1 | 6/2012 | Goda et al. | |

OTHER PUBLICATIONS

EP Application No. 13151698.1, Extended Search Report dated Jan. 8, 2014.
EP Application No. 13151698.1, Extended Search Report dated Feb. 19, 2014.
U.S. Appl. No. 13/755,606, Mu, et al., Office Action—Rejection, mailed Jun. 20, 2014.

* cited by examiner

*Primary Examiner* — Vu Le

(57) ABSTRACT

A semiconductor device comprises an array of memory cells. Each of the memory cells includes a tunnel dielectric, a well region including a first current electrode and a second current electrode, and a control gate. The first and second current electrodes are adjacent one side of the tunnel dielectric and the control gate is adjacent another side of the tunnel dielectric. A controller is coupled to the memory cells. The controller includes logic to determine when to perform a healing process in the tunnel dielectric of the memory cells, and to apply a first voltage to the first current electrode of the memory cells during the healing process to remove trapped electrons and holes from the tunnel dielectric.

20 Claims, 3 Drawing Sheets

|  | PROGRAM | ERASE | HEAL |
|---|---|---|---|
| VS | 0 | UNTIED | 0 |
| VD | 4.5 | UNTIED | 4.5 |
| VCG | 9.0 | -9.0 | 0 |
| VPW | 0 | 4.2 → 9.0 | 0 |

STRUCTURE AND METHOD FOR HEALING TUNNEL DIELECTRIC OF NON-VOLATILE MEMORY CELLS

BACKGROUND

1. Field

This disclosure relates generally to non-volatile memories, and more specifically, to healing tunnel dielectrics of non-volatile memory cells.

2. Related Art

Non-volatile memories (NVMs) have a limited life due to a limited number of cycles, which is called endurance, and to a limited amount of time that the NVM can retain data, which is called data retention. Data retention is primarily related to how well the charge in a floating gate of an NVM cell is retained in the floating gate. There is a point at which enough charge has leaked out of the floating gate that the state of the NVM cell cannot be reliably detected. Similarly with endurance, after enough cycles of programming and erasing, charge is not easily placed into the floating gate or removed from the floating gate. The basic notion of healing is desirable because it can potentially be used to improve an NVM made using an existing process. Thus, whatever improvements made by the healing are additive to improvements in the processing. Also the particular architecture for implementing the NVM can impact how a healing technique can be used to improve data retention and endurance.

Thus there is a need to provide an NVM that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Tunnel dielectric healing is achieved using a drain voltage that is higher than the control gate voltage, the well voltage, and the source voltage. This approach is effective in drawing electrons that have been trapped in the tunnel dielectric out of the tunnel dielectric and thereby improving endurance and data retention.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
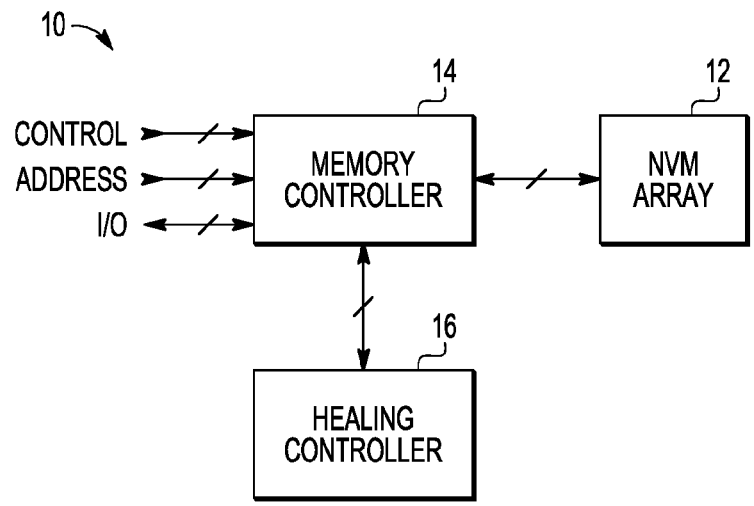
FIG. 1 is a block diagram of a non-volatile memory (NVM) according to an embodiment.

Shown in FIG. 1 is a non-volatile memory (NVM) 10 having an NVM array 12, a memory controller 14, and a healing controller 16. Memory controller 14 and array 12 are connected by a bus. Healing controller 16 is a connected to memory controller 14 by a bus. Memory controller 14 inputs and outputs data using a bus and receives control signals from a bus and addresses from a bus. Memory controller 14 controls what data is written into and read out from NVM array 12 using the control, address, and I/O signals. The writing is typically called programming for NVMs and, in the case of NVM 12 being a flash memory, NVM cells are erased in large blocks in preparation for being programmed. Thus writing data includes both erasing and programming and thus is often referenced as a program/erase cycle. Healing controller 16 monitors the operation of memory controller 14 and indicates to memory controller 14 when a healing operation is to be performed.

Figure 2:
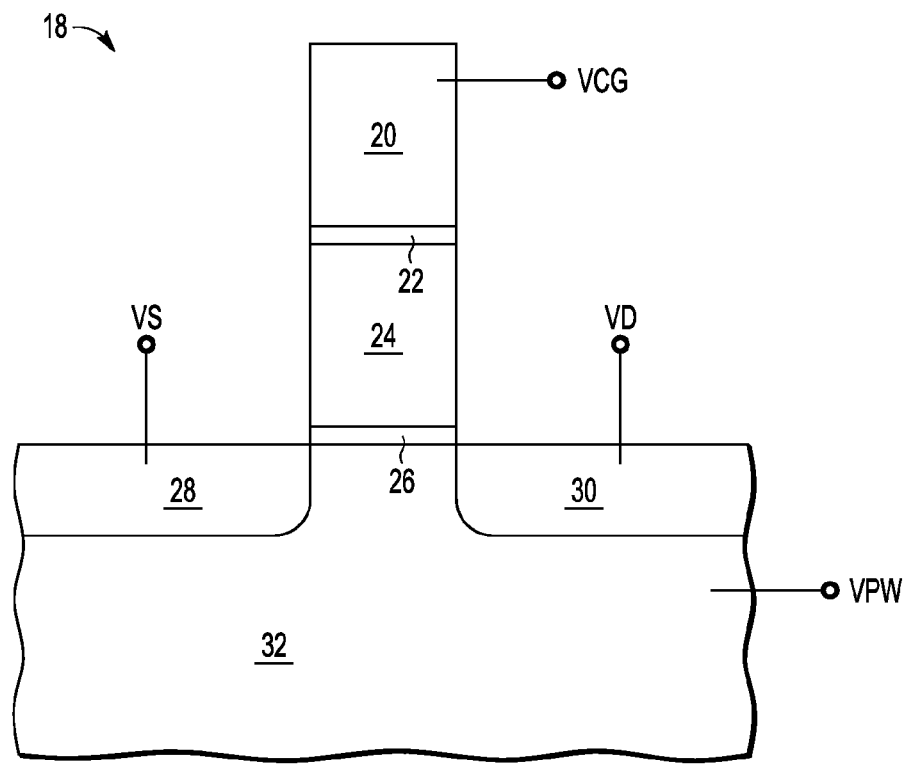
FIG. 2 is a cross section of an NVM cell of the NVM of FIG. 1.
Figure 3:
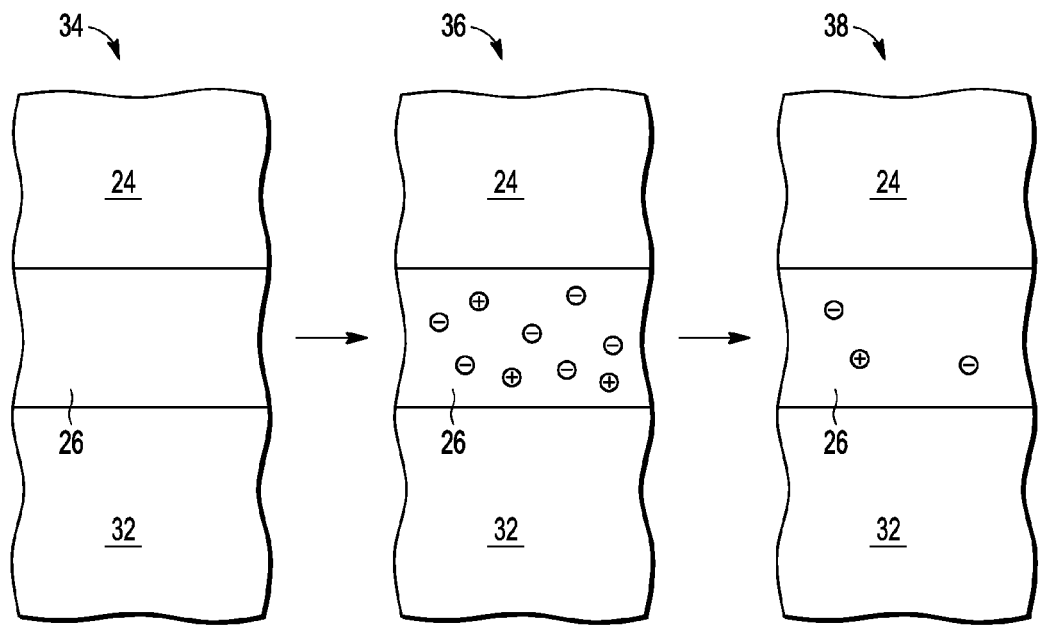
FIG. 3 is a series of sequential cross sections of a portion of the NVM cell of FIG. 2.

Shown in FIG. 2 is an NVM cell 18 representative of the memory cells of NVM array 12. NVM cell 18 is a floating gate type NVM cell having a control gate 20, an interface dielectric 22 under control gate 20, a floating gate 24 under interface dielectric 22, a tunnel dielectric 26 under floating gate 24, a channel region in a semiconductor layer 32 under tunnel dielectric 26, a source 28 in semiconductor layer 32 substantially aligned to a first side of floating gate 24, and a drain substantially aligned to a second side of floating gate 24. Control gate 20 is substantially aligned to source 28 and drain 30 also. The channel region is between source 28 and drain 30. Semiconductor layer 32 may be formed in a semiconductor substrate. An effective way of achieving desired characteristics of semiconductor layer 32 is to dope the substrate to a desired conductivity type and concentration for use in forming NVM cells. One way to achieve this is to begin with a P-type substrate, form an N-type well in the P-type substrate, and then form a P well within the N well whereby the P well is isolated from the substrate. Thus, semiconductor layer 32 may be referenced as a well and, because the typical preference is that the conductivity type be P, more specifically as P well 32. Terminals are connected control gate 20, source 28, drain 30, and P well 32 so that a selected control gate voltage VCG, a selected source voltage VS, a selected drain voltage VD, and a selected well voltage VPW may be applied to them, respectively. Shown in FIG. 3 is a stage 34, a stage 36, and a stage 38 of tunnel dielectric 26 as program/erase cycles are performed. At stage 34, minimal program/erase cycles have been performed and there is no discernible charge trapping in tunnel dielectric 26. After a significant number, for example 20,000, of program/erase cycles have been performed, charge trapping has occurred that has begun to affect endurance and data retention as shown in stage 36. After a healing cycle has been performed, the charge trapping has been significantly reduced as shown in stage 38 of FIG. 3.

Figure 4:
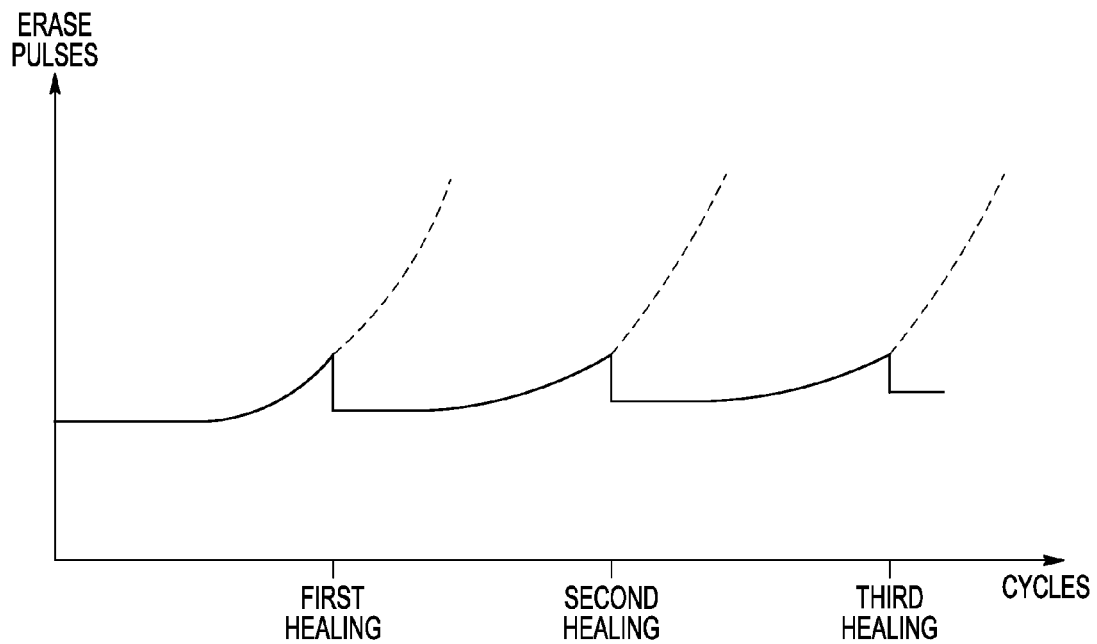
FIG. 4 is a graph of erase pulses required to achieve a specified erased condition versus program/erase cycles.

Shown in FIG. 4 is a plot of the number of erase pulses required to achieve erasure of the NVM array versus the number of program/erase cycles and the result of a first healing, a second healing, and a third healing. As erasing begins, the number of pulses per cycle increases very slowly and then begins to increase exponentially. At this point, which evidence indicates may be about 20,000 cycles, the first healing is performed which brings the number of pulses per cycle to the nearly the same level as at the beginning. The dotted lines show that the erase pulses per cycle will continue to increase in the absence of the first healing. A similar situation to that at the beginning commences after the first healing in which the erase pulses per cycle slightly increases then again begins increasing exponentially. A second healing is then performed after about another 20,000 more cycles. This may be shortened as needed to ensure that the erase pulses per cycle is about the same as for the timing of the first healing. A third healing is then performed with similar results for the first and second healing.

Figures 5, 6:
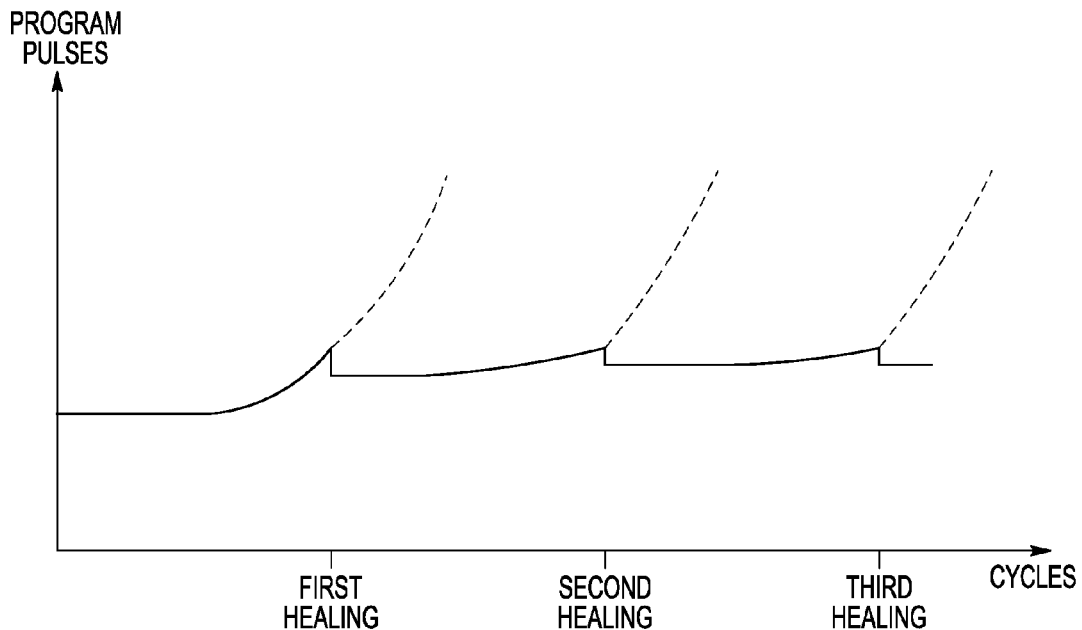
FIG. 5 is a graph of program pulses required to achieve a specified programmed condition versus program/erase cycles.
FIG. 6 is a table showing conditions for program, erase, and healing.

Shown in FIG. 5 is a plot of the number of program pulses required to achieve programming of cells NVM array 12 versus the number of program/erase cycles and the result of the first healing, the second healing, and the third healing. As programming begins, the number of pulses per cycle increases very slowly and then begins to increase exponentially. At this point, which similar to erasing evidence indicates may be about 20,000 cycles, the first healing is performed which brings the number of pulses per cycle to the nearly the same level as at the beginning. The dotted lines show that the program pulses per cycle will continue to increase in the absence of the first healing. A similar situation to that at the beginning commences after the first healing in which the program pulses per cycle slightly increases then again begins increasing exponentially. A second healing is then performed after about another 20,000 more cycles. This may be shortened as needed to ensure that the program pulses per cycle is about the same as for the timing of the first healing. A third healing is then performed with similar results for the first and second healing.

Shown in FIG. 6 is a table showing the conditions for source voltage VS, drain voltage VD, control gate voltage VCG, and P well voltage VPW as applied by memory controller 14. For a programming pulse, source voltage VS is applied at ground, drain voltage VD is at 4.5 volts, control gate voltage VCG is applied at 9.0 volts, and well voltage VPW is applied at ground. This provides for current flow from drain to source in which the positive control gate voltage attracts electrons to the floating gate by hot carrier injection. Pulses are applied at these conditions until desired programming has been reached. Each such pulse is considered one of the pulses in a program/erase cycle. Programming and erasing are performed in response to control signals. For erasing, source 28 and drain 30 are untied, control gate voltage VCG is applied at negative 9.0 (−9.0) volts, and well voltage VPW is stepped from 4.2 up to 9.0 volts. Each step is considered one of the pulses in the program/erase cycle. With up to an 18 volt differential between P well 32 and control gate 20, electrons are pulled from floating gate to P well 32 by Fowler-Nordheim tunneling. Source 28 and drain 30 will naturally fall to a P/N junction drop below the positive voltage applied at P well 32 which will be about 8.3 volts in this case. For healing, which is in response to signals from healing controller 16, source voltage VS, control gate voltage VCG, and well voltage VPW are applied at ground, and drain voltage VD is applied at 4.5 volts. The result is that a high percentage of electrons are drawn from tunnel dielectric 26 and also holes are pushed out of tunnel dielectric 26. The healing procedure, in fact, takes advantage of an elevated temperature at the junction between drain 30 and P well 32.

Although charge trapping in the tunnel dielectric occurs during programming and erasing, often by hole/electron pair formation, the charges are trapped for significant time periods but are more mobile than the electrons in the floating gate. Thus, a predetermined threshold voltage that is achieved in large measure by charge trapping is more easily disadvantageously reduced than a threshold voltage that has been achieved with little affected from charge trapping. In this manner, the healing improves data retention. Charge trapping can be so significant that charge cannot be easily placed into or removed from the floating gate. With the healing steps, the charge can be easily placed into the floating gate and removed from the floating gate at the larger cycle counts thereby improving endurance.

Alternative techniques for determining when a healing step should be performed include simply performing a healing step after every set number of cycles, reducing the number of cycles between healing steps for each additional healing step, and performing a healing step when the number of erase/program pulses per cycle reaches a certain level. This may be for a single NVM cell or for an average or for some small set number such as ten NVM cells that exceed a predetermined pulse count. Another possibility is to base the healing steps on time or some combination of time with one of the above criteria. For example, perform a healing step every 20,000 cycles or after 6 months if the 20,000 cycles had not occurred within the 6 months.

The detection that it is time for a healing step does not necessarily mean that it needs to be done immediately. Power down may be the preferred time to perform a healing step. In such case, assuming that power is still available, the performance of the healing step can be done after it appears the device has shut down. For example, in an automotive application, typically power is still available when the vehicle is turned off so the healing step can be performed when the vehicle is turned off. It may be necessary to have a memory available to temporarily store the information in the NVM during the healing step. At power down the random access memory is not expected to be actively storing data in which case the random access memory can be used to store the NVM data during the healing step.

By now it should be appreciated that there has been provided a semiconductor device that includes an array of memory cells, wherein each of the memory cells includes a tunnel dielectric, a well region including a first current electrode, a second current electrode, and a channel region between the first current electrode and the second current electrode, a floating gate wherein the tunnel dielectric is over the channel region and the floating gate is over the tunnel dielectric, an interface dielectric over the floating gate, and a control gate over the interface dielectric. The semiconductor device further includes a controller coupled to the memory cells, wherein the controller includes logic to determine when to perform a healing process in the tunnel dielectric of the memory cells, and to apply a first voltage to the first current electrode of the memory cells during the healing process to remove trapped electrons and holes from the tunnel dielectric. The semiconductor device may further include logic to apply another voltage to the second current electrode and a control gate during the healing process. The semiconductor device may have a further characterization by which the controller includes logic to apply another voltage to the well region during the healing process. The semiconductor device may have a further characterization by which the healing process takes advantage of an elevated temperature at a junction between the first current electrode and the well region. The semiconductor device may further include logic to perform the healing process after a threshold number of program and erase cycles. The semiconductor device may further include logic to perform subsequent healing processes after successively reduced numbers of program and erase cycles. The semiconductor device may further include logic to perform the healing process when a threshold number of pulses are required to erase the memory cells. The semiconductor device may further include logic to perform the healing process once a threshold number of pulses are required to program the memory cells. The semiconductor device may have a further characterization by which the controller is further operable to perform the healing process after the memory cells have operated over a specified number of program/erase cycles.

Also disclosed is a method that includes performing a healing process to reduce trapped holes and electrons in a tunnel dielectric of a semiconductor memory cell, wherein the tunnel dielectric is located between first and second current electrodes and a floating gate, and when performing the healing process, applying a healing voltage to the first electrode of the memory cell, wherein the healing voltage is sufficient to remove at least some of the trapped holes and electrons while being low enough to avoid moving electrons from the floating gate to the tunnel dielectric. The method may further include applying a second voltage to a second current electrode of the semiconductor memory cell. The method may further include applying other voltages to a second current electrode, a control gate, and a well region of the semiconductor memory cell during the healing process. The method may further include performing the healing process after a threshold number of program and erase cycles. The method may further include performing subsequent healing processes after successively lower threshold numbers of program and erase cycles. The method may further include performing the healing process when a number of pulse counts indicates degraded operation of the semiconductor memory cell. The method may further include performing the healing process after a fixed time of operation of the semiconductor memory cell. The method may have a further characterization by which the healing process takes advantage of an elevated temperature at a junction between the first current electrode and a well region.

Disclosed also is a semiconductor device that includes an array of nonvolatile memory cells. The Semiconductor device further includes a controller coupled to the array, wherein the controller is configured with logic operable to perform a healing process to reduce trapped holes and electrons in a tunnel dielectric, wherein the tunnel dielectric is located over a well region with current electrodes and a floating gate in the memory cells, and the healing process includes applying a first voltage to one of the current electrodes and a second voltage to a control gate and another one of the current electrodes. The semiconductor device may further include logic in the controller to determine when to perform the healing process based on efficiency of program or erase operations of the memory cells. The semiconductor device may have a further characterization by which the first voltage is low enough to avoid causing electrons in the floating gate to move to the tunnel dielectric.

Although the invention is described herein with reference to specific embodiments, various modifications and changes can be made without departing from the scope of the present invention as set forth in the claims below. For example, particular voltages were provided as examples of choices that are believed to provide effective operation, but other voltage levels may be selected for effective use as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    an array of memory cells, wherein each of the memory cells includes a tunnel dielectric, a well region including a first current electrode, a second current electrode, and a channel region between the first current electrode and the second current electrode, a floating gate wherein the tunnel dielectric is over the channel region and the floating gate is over the tunnel dielectric, an interface dielectric over the floating gate, and a control gate over the interface dielectric; and
    a controller coupled to the memory cells, wherein the controller includes logic to determine when to perform a healing process in the tunnel dielectric of the memory cells, and to apply a first voltage to the first current electrode of the memory cells during the healing process to remove trapped electrons and holes from the tunnel dielectric, wherein the first voltage is sufficient to draw at least some of the trapped electrons out of the tunnel dielectric.

2. The semiconductor device of claim 1 the controller further comprising:
    logic to apply another voltage to the second current electrode and a control gate during the healing process.

3. The semiconductor device of claim 1 wherein the controller includes logic to apply another voltage to the well region during the healing process.

4. The semiconductor device of claim 1 wherein:
    the healing process takes advantage of an elevated temperature at a junction between the first current electrode and the well region.

5. The semiconductor device of claim 1 further comprising:
    logic to perform the healing process after a threshold number of program and erase cycles.

6. The semiconductor device of claim 5 further comprising:
    logic to perform subsequent healing processes after successively reduced numbers of program and erase cycles.

7. The semiconductor device of claim 1 further comprising:
    logic to perform the healing process when a threshold number of pulses are required to erase the memory cells.

8. The semiconductor device of claim 1 further comprising:
  logic to perform the healing process once a threshold number of pulses are required to program the memory cells.

9. The semiconductor device of claim 1 wherein the controller is further operable to
  perform the healing process after the memory cells have operated over a specified number of program/erase cycles.

10. A method comprising:
  performing a healing process to reduce trapped holes and electrons in a tunnel dielectric of a semiconductor memory cell, wherein the tunnel dielectric is located between first and second current electrodes and a floating gate, and when performing the healing process, applying a healing voltage to the first electrode of the memory cell, wherein the healing voltage is sufficient to draw at least some of the trapped electrons out of the tunnel dielectric while being low enough to avoid moving electrons from the floating gate to the tunnel dielectric.

11. The method of claim 10 further comprising:
  applying a second voltage to a second current electrode of the semiconductor memory cell.

12. The method of claim 10 further comprising:
  applying other voltages to a second current electrode, a control gate, and a well region of the semiconductor memory cell during the healing process.

13. The method of claim 10 further comprising:
  performing the healing process after a threshold number of program and erase cycles.

14. The method of claim 13 further comprising:
  performing subsequent healing processes after successively lower threshold numbers of program and erase cycles.

15. The method of claim 10 further comprising:
  performing the healing process when a number of pulse counts indicates degraded operation of the semiconductor memory cell.

16. The method of claim 10 further comprising:
  performing the healing process after a fixed time of operation of the semiconductor memory cell.

17. The method of claim 10 wherein:
  the healing process takes advantage of an elevated temperature at a junction between the first current electrode and a well region.

18. A semiconductor device comprising:
  an array of nonvolatile memory cells; and
  a controller coupled to the array, wherein the controller is configured with logic operable to perform a healing process to reduce trapped holes and electrons in a tunnel dielectric, wherein the tunnel dielectric is located over a well region with current electrodes and a floating gate in the memory cells, and the healing process includes applying a first voltage to one of the current electrodes and a second voltage to a control gate and another one of the current electrodes, and wherein the first voltage is sufficient to draw at least some of the trapped electrons out of the tunnel dielectric.

19. The semiconductor device of claim 18 further comprising:
  logic in the controller to determine when to perform the healing process based on efficiency of program or erase operations of the memory cells.

20. The semiconductor device of claim 18 wherein:
  the first voltage is low enough to avoid causing electrons in the floating gate to move to the tunnel dielectric.

* * * * *